United States Patent [19]
Abbiate et al.

[11] Patent Number: 5,210,774
[45] Date of Patent: May 11, 1993

[54] ADAPTIVE EQUALIZATION SYSTEM AND METHOD FOR EQUALIZING A SIGNAL IN A DCE

[75] Inventors: Jean-Claude Abbiate, La Gaude; Gerard Richter; Jean-Pierre Vaudaux, both of Nice, all of France

[73] Assignee: International Business Machines Corp., Armonk, N.Y.

[21] Appl. No.: 774,496

[22] Filed: Oct. 10, 1991

[30] Foreign Application Priority Data

May 31, 1991 [EP] European Pat. Off. ........ 91480089.3

[51] Int. Cl.$^5$ .............................................. H03H 7/30
[52] U.S. Cl. .................................... 375/14; 364/724.2
[58] Field of Search ....................... 375/12, 13, 14, 15, 375/121, 109; 379/394, 414; 333/18, 28; 364/724.2

[56] References Cited

U.S. PATENT DOCUMENTS

| | | | |
|---|---|---|---|
| 4,621,366 | 11/1986 | Cain et al. | 375/13 |
| 4,979,184 | 12/1990 | Bottoms et al. | 375/13 |
| 5,031,193 | 7/1991 | Atkinson et al. | 375/13 |

FOREIGN PATENT DOCUMENTS 0176312 4/1986 European Pat. Off. .

OTHER PUBLICATIONS

Patent Abstracts of Japan, vol. 15, No. 40 (E-1028) (4568) Jan. 30, 1991, and JP-A-2 277 323 (Hitachi) Nov. 13, 1990.
Patent Abstracts of Japan, vol. 11, No. 61 (E483) (2508) Feb. 25, 1987 and JP-A-61 220 547 (Fujitsu) Sep. 30, 1986.
IEEE International Conference on Communications, Toronto, Jun. 22-25, 1986, vol. 3, 1986, New York, pp. 1466-1471, Baccetti et al., "Full Digital Adaptive Equalization in 64QAM Radio Systems".

*Primary Examiner*—Stephen Chin
*Attorney, Agent, or Firm*—Edward H. Duffield

[57] ABSTRACT

An adaptive equalization system for allowing the equalization of a base-band line of a DCE within a predetermined range, includes an adaptive equalizer for continuously adapting its coefficients in accordance with a predetermined adaptive algorithm. The equalizer includes storage for a plurality of sets of initial coefficients for the equalization process corresponding to a plurality of telecommunication line characteristics and circuits for estimating the energy of the received signal. From the estimation of the energy of the signal on the line, there is derived one set among the plurality of sets of initial coefficients which are then used for setting the equalization before initiating the convergence process. An efficient and very simple equalization process is therefore provided which is ensured to converge whatever the characteristics of the line within the considered range.

8 Claims, 5 Drawing Sheets

FIG. 6
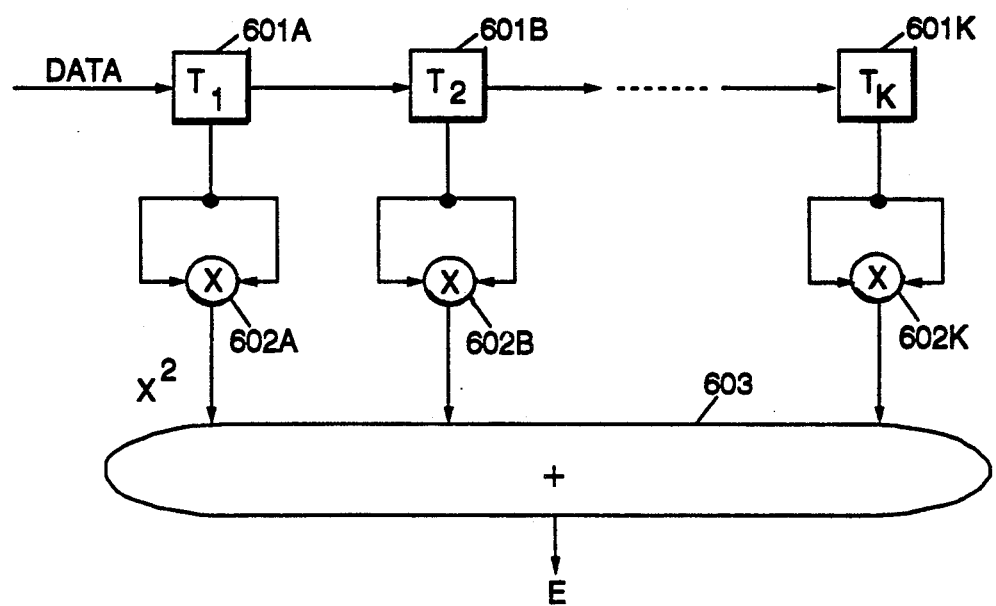
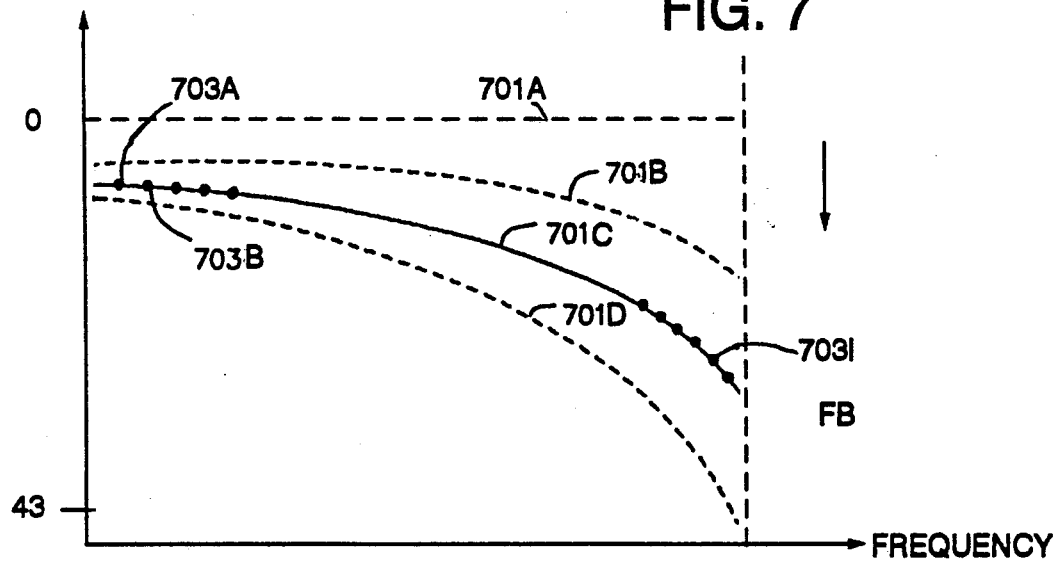
FIG. 7

ADAPTIVE EQUALIZATION SYSTEM AND METHOD FOR EQUALIZING A SIGNAL IN A DCE

TECHNICAL FIELD

The invention relates to an adaptive equalization system and particularly to a system for allowing the equalization within a predetermined range of a telecommunication base-band line in a Data Circuit Terminating Equipment.

BACKGROUND ART

It is well known in the art that in establishing communications between DCE's or modems, a training sequence may be sent between the data circuit terminating equipment (DCE) or modem sending the information to the DCE or modem receiving the information prior to the transmission of actual data. The training sequence is typically used for synchronization purposes and also for permitting the receiving modem to detect and compensate for the amplitude and phase delay characteristics of the channel over which the data is to be sent. The compensation of the intersymbol interference is achieved by the use of equalizers or adaptive equalizers located in the receiving modem which analyzes the received training sequence and adapts its coefficients accordingly. However it has appeared that in some situation it is impossible for a modem which is connected to a telecommunication network to transmit or receive any training sequence.

FIGS. 1 and 2 shows two typical examples in which no training sequence is allowed. In FIG. 1, a base-band modem 101 is connected to a digital network 103 via an input node 102. The network does not authorize the base-band modem 101 to transmit and to receive any training sequence through the digital network. The latter modem has to adjust its equalizer directly without the use of a training pattern. FIG. 2 illustrates a similar case of a multipoint network 203 in which a control station 201 communicates with some tributary stations 202. Since the connection of an extra tributary station 202 should not interrupt the communication of the already existing stations, the equalizer system included in this supplementary station has to adjust its coefficient without the use of any training sequence.

OBJECTS OF THE INVENTION

The technical problem to be solved by the present invention is to provide a method and an adaptive equalization system for a DCE which can be connected to an existing telecommunication network and which does not require the use of any training sequence.

BRIEF SUMMARY OF THE INVENTION

This problem is solved by the adaptive equalization system in accordance with the present invention by including in each modem means for storing a plurality of sets of initial coefficients for the equalization process corresponding to a plurality of telecommunication lines and means for measuring the energy of the received signal. From the estimation of the energy of the signal on the line, the modem derives or selects one set among the plurality of sets of initial coefficients which is then used for setting the equalization parameters before initiating the convergence process. An efficient and very simple equalization process is therefore provided in which convergence is ensured so long as the characteristics of the line are within the considered range. More accurately, the system according to the present invention includes the means which are recited in claim 1.

Preferably, the system in accordance with the present invention includes an adaptive digital equalizer using a digital processing system involving a mean-square algorithm.

In a preferred embodiment the system according to the present invention includes means for comparing the received and measured energy to a plurality of threshold values and for generating or selecting, in response to said comparison, an initial set of coefficients before initiating said adaptive algorithm.

BRIEF DESCRIPTION OF THE DRAWINGS

FIG. 6 details the structure of the energy estimation process of block 310.

FIG. 7 is a view of the four transfer functions involved in the preferred embodiment of the invention.

DETAILED DESCRIPTION OF THE PREFERRED EMBODIMENT OF THE INVENTION

Figure 1:
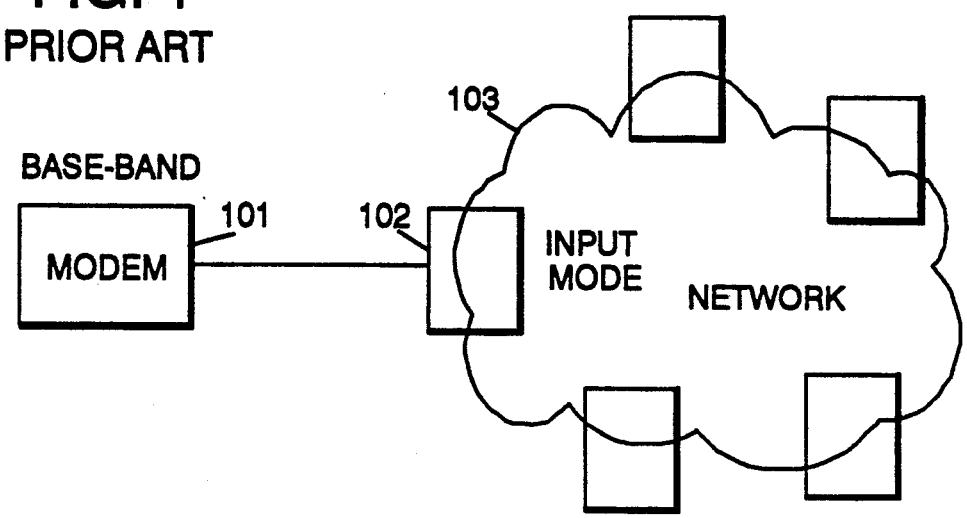
FIG. 1 illustrates a prior art digital network which can advantageously uses a DCE in accordance with the present invention.
Figure 2:
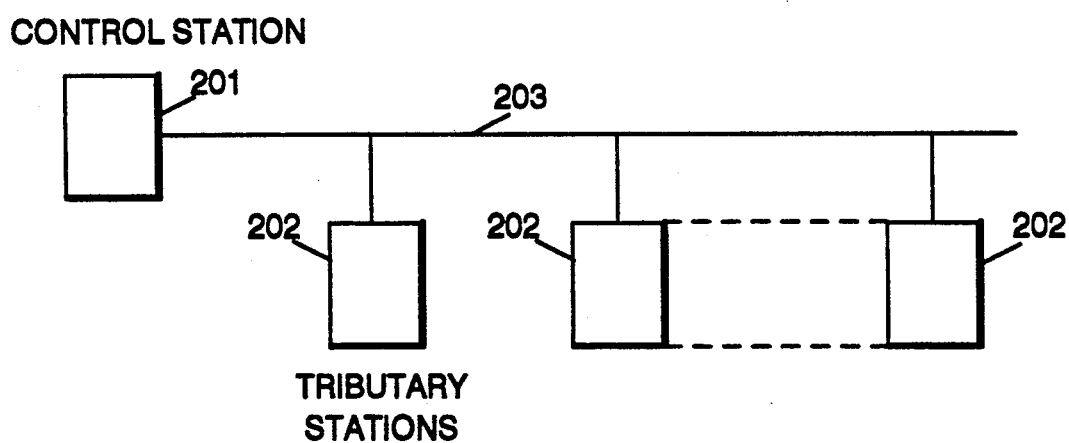
FIG. 2 shows a prior art multipoint connection network in which a DCE according to the present invention can be advantageously used.
Figure 3:
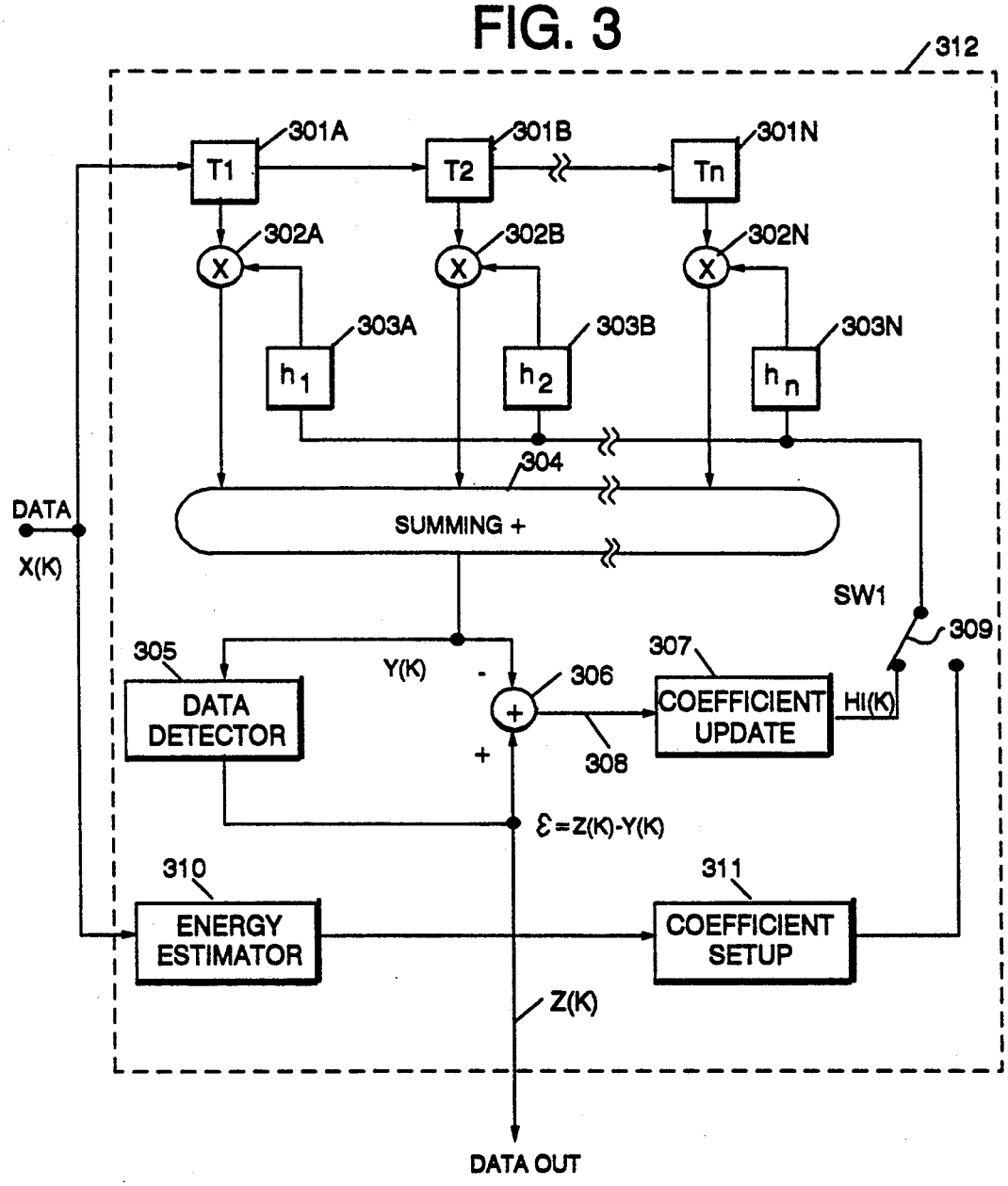
FIG. 3 shows the structure of an adaptive equalizer in accordance with the present invention.

FIG. 3 shows the structure of a digital adaptive equalizer 312 in accordance with the present invention. In the preferred embodiment of the invention, the equalizer is based on a digital process system using digital filters. The equalizer 312 involves a plurality of taps 301a–301n for storing values x(k) (x(k) being the k-th input sample) of the incoming signal, a plurality of multipliers 302a to 302n, a summing means 304 for summing the products of the plurality of multipliers 302a to 302n. Summing means 304 generates the series of equalized data values y(k) which is then entered into a data detector 305, or data recovery circuit, which derives the estimated data bits z(k). The equalizer output y(k) at the output of summing means 304 is also substracted from the output z(k) of data detector 305 by means of substractor 306 in order to provide an error signal 308 which is then transmitted to COEFFICIENT UPDATE block 307. Block 307 performs an analysis of the error signal 308 provided at the output of subtractor 306 and derives a new set of coefficients for taps 301a to 301n in accordance with a determined algorithm. A well known algorithm which is traditionally used to compute the set of coefficient is the gradient or mean square algorithm which continuously minimizes the Mean-square error between the output data signal and the estimated signal.

Let us call hi(k) the i-th coefficient of the filter which is stored in its corresponding multiplier 303, Xk the vector comprising a set of n samples (x(k), x(k+1), x(k+2), ..., x(k-n+1)), Hk the vector formed by the n coefficients (h1(k), h2(k), h3(k), ..., hn(k)) which are stored in coefficients blocks 303a to 303n. The output y(k) is then related to the input Xk by the following relation:

$$y(k) = Xk^T \cdot Hk \quad (Xk^T = \text{Transpose of the vector Xk})$$

where: $Xk^T$ is the Transpose of the vector Xk, i.e.:

$$Xk^T = \begin{matrix} x(k) \\ x(k-1) \\ \vdots \\ x(k-N+1) \end{matrix}$$

The Mean-square algorithm involved in block 307 is intended to minimize the mean-square error:

$$f(H) = E(z - X^T H^2)$$

The optimum $H^*$ of this function is the solution of the following equation:

$$E(X \cdot X^T) \cdot H^* = E(z \cdot X)$$

The uniqueness and existence of $H^*$ is ensured by the invertibility of the matrix $$E(X \cdot X^T)$$

The optimum cannot be calculated directly at each received sample because it would use too much computation power. However, the Mean-square iterative algorithm progressively calculate the optimum H vector by providing a continuous convergence process of the vector H toward the optimum $H^*$. This is achieved by the following relation:

$$H(k+1) = H(k) + p \cdot (z(k) - Xk^T Hk) \cdot Xk$$

where p is a small coefficient which is used in order to adjust the convergence process.

It has appeared that the convergence of the Mean-square algorithm performed by block 307 of FIG. 3 is assured provided that the vector Hk lies in a small neighborhood of $H^*$, that is if the eye pattern of the equalizer 312 is initially opened. If the latter requirement is not satisfied, the vector Hk converges toward other stationary points, each having its own attraction domain. Even if some of these convergence points may result in a poor error rate, the equalization process appears to be not satisfactory. As mentioned above, a well known method to reach initially the neighborhood of $H^*$ involves the use of an initial training period during which a reference signal is sent to the equalizer and used to adjust the coefficient. In a multipoint data network or still in a digital network, no learning sequence is available since a control station can not send this sequence when a tributary station is connected to the network. The convergence of the Mean-Square algorithm is achieved only when the telecommunication line remains short enough to ensure the opening of the eye pattern of the equalizer.

The opening of the eye pattern in the equalizer is achieved by the combination of blocks 310 and 311 which performs a first analysis of the incoming signal prior to the initiation of the Mean-square algorithm performed by block 307. For that purpose, energy estimator 310 receives the incoming signal and provides COEFFICIENT SETUP block 311 with a value representing a measure of the estimated energy which is received on the line. From the estimation of the energy received on the line, Block 311 then generates a set of initial coefficients H(init) for multiplying samples from taps 301a to 301n which are transmitted during a preliminary period to use the coefficients in 303a to 303n by means of a switch 309. During the normal adaptive process, functional switch 309 connects the output of block 307 to the input of coefficient blocks 303a to 303n and therefore carries out the adaptive process in accordance with the Mean-square algorithm.

Figure 4:
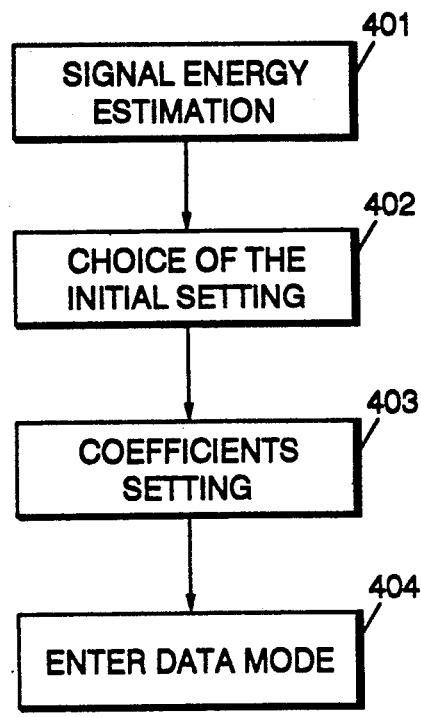
FIG. 4 illustrates the basic principle of the equalization process according to the present invention.

FIG. 4 illustrates the basic operations which are involved in accordance with the present invention. When the DCE is connected to a telecommunication network, the equalizer is set to a preliminary mode in which the incoming signal received by the modem is analyzed by block 310 in order to determine a measure of its energy in step 401. The value corresponding to the measure of this energy is then entered into functional block 311 which computes an initial set of coefficients in step 402. As will be explained hereinafter, the set of initial coefficients which is calculated by block 311 does not fully match the characteristics of the line, but is, however, such as will assure the convergence of the gradient or mean square algorithm whenever the equalizer switches to a normal adaptive mode in which block 307 becomes operative. During the preliminary mode, the computed initial set of coefficients is entered into the coefficient block 303a to 303b of equalizer 312 by means of switch 309 in step 403. The equalizer switches then into a normal adaptive mode involving the continuous updating of the equalizer coefficients by block 307 using the mean square or gradient algorithm in step 404. The adaptive equalizer becomes, therefore, able to adapt itself directly on the incoming signal without requiring the use of any training sequence.

Figure 5:
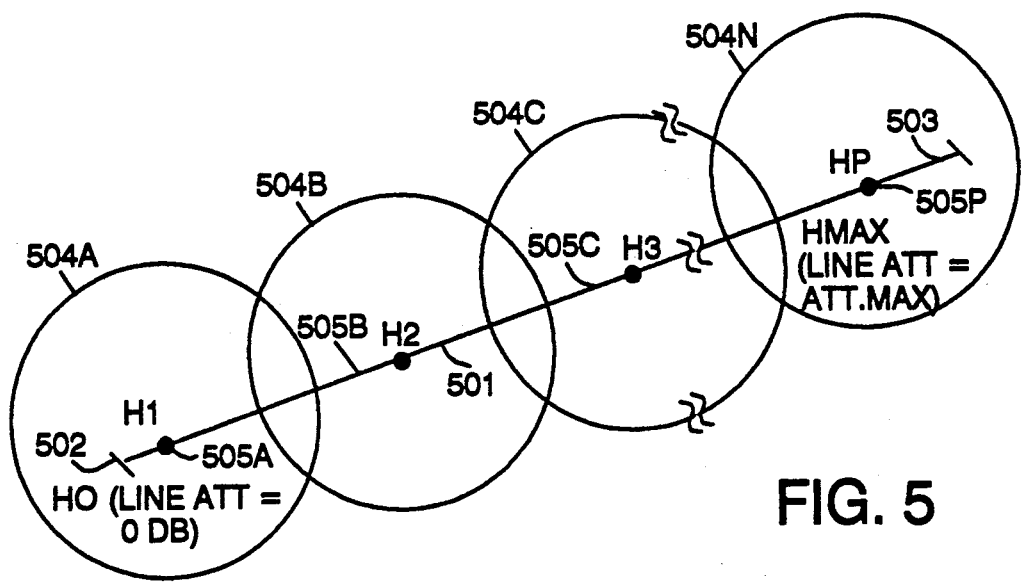
FIG. 5 is another view illustrating the principle of the present invention.

FIG. 5 illustrates how the functional block 311 generates an initial set of coefficients during the preliminary mode. As a first approximation, it has appeared that the vector $H^*$, which is formed by the values of the n coefficients Hk of the adaptive equalizer which exactly compensates for the attenuation of the characteristics of the considered channel, depends only on the length of the line: $H^* = f(l)$. Therefore, the H vector will move on a determined 1-dimension hypercurve 501 as a function of the attenuation value of the line. Assuming that the line has a minimal length (near zero), the attenuation which will be introduced will be also minimal (i.e. about 0 dB) as shown in the curve 701a in FIG. 7, and the coefficients of the equalizer will be set to values corresponding to a vector Hmin located on a position 502 on curve 501. Conversely, if the length of the line is at its maximum value, the attenuation level of the line is at its maximum, for instance a level of 43 dB attenuation at bit frequency, and the coefficients of the digital equalizer must be set at values corresponding to a vector Hmax located on a position 503 at the other end of curve 501. If the value of the attenuation level at bit frequency which is introduced by the line is intermediate—if the level is comprised within the range (0 dB, 43 dB), the coefficients 303a to 303n of equalizer must be set to values corresponding to an optimal H vector which is located on an intermediate position on curve 501.

Let us call d the radius of the "circle" around a determined optimal vector H; that is to say, a vector H which coefficients perfectly compensate for the attenuation of a determined line, which assures the convergence of the gradient algorithm within that circle. Thus, the equalization process in equalizer 312 loaded with initial values which corresponds to a H vector located within the above "circle" is assured to converge only by means of functional block 307. The radius "d" depends in a first order approximation on the signal to noise ratio (line + quantization) which is available for the input signal. Now, in accordance with the present invention, there is chosen a finite set of p H vectors 505a, 505b, 505c ... 505p ... which are located on curve 501 and which are separated by a distance being less than or equal to the distance d. As illustrated in FIG. 5, the set of p H vectors provides a full overlap of the curve 501 in the whole attenuation range which is considered. (in our example 0 to 43 dB). Each of the p H vectors 505a, 505b, 505c ... corresponds to an optimal H vector for a determined level of attenuation of the line. Each of the p H vectors 505a, 505b, 505c ... also corresponds to a determined level of energy existing in the incoming signal. The p H vectors therefore correspond to a set of p levels of energy Ea, Eb, Ec ... which are distributed in the full range of energy of the incoming signal.

The full range of energy can be divided in subranges, each sub-range being centered around one of the above levels of energy: a first level of energy Ea being located at the middle of a first energy range (E0, E1); the second level of energy Eb being located at the middle of a second energy range (E1, E2) etc.

The set of p H vectors 505a, 505b, 505c ... are stored in a memory which is associated with the digital signal processor which embodies equalizer 312. As will be explained hereinafter, equalizer 312, and particularly block 311, generates from the estimation of the energy of the incoming signal a unique initial vector Hinit which is chosen among the p H vectors 505a, 505b, 505c ... The unique initial vector Hinit which is generated by block 311 comprises a corresponding set of coefficients which are transmitted to functional blocks 303a to 303n by means of functional switch 309 during the preliminary mode. The latter set of coefficients are used as initial values for equalizer 312 which switches then to the normal adaptive mode where block 307 is operative alone.

As explained above, the set of p H vectors 505a, 505b, 505c to be stored in the memory is determined from the value of the above radius. The skilled man will easily determine the appropriate value of the above radius which assures the convergence of the gradient algorithm for any specific case. Such a determination can be performed either by means of straightforward physical measures or also by means of simulations. In the preferred embodiment of the invention, the DCE is intended to be connected to digital network by a line characterized by an attenuation level within a range of (0, 43 dB) at a bit frequency of 72 khz. It has appeared that, for that peculiar case, a set of only 4 initial vectors located uniformly on attenuation curve 501 is sufficient to assure the convergence of the gradient algorithm. Since the amount of processing operations which must be performed by the digital processing system is negligible, a very simple equalizer 312 is provided which immediately and automatically adjusts its coefficients at the reception of an incoming signal without the use of any training sequence. The coefficients to be loaded into block 303a to 303n, and which correspond to an initial vector Hinit determined, can be easily computed by performing first a reverse Fourrier transformation of the transfer function of the line corresponding to the Hinit vector which is considered. The reverse Fourrier transformation is calculated using a traditional window function well known to the skilled man. In the preferred embodiment, the 4 initial H vectors are chosen so as to correspond to a line which respectively generates an attenuation level of 10, 20, 30 and 40 dB.

FIG. 7 shows the corresponding transfer functions 701a to 701d of the above four lines. For each attenuation level, the corresponding transfer function allows the computation of the reverse Fourrier transformation of the line. Practically, it can be advantageous to consider 64 points 703a, 703b, ... , 703l of each curve which lead to 64 points of the impulse response of the line and, eventually to the coefficients to the equalizer 312 which corresponds to the initial H vector which is considered.

The choice of one Hinit vector among the p initial vectors which are stored in the memory associated with the digital processing system is performed by block 301 which analyses and measures the energy of the incoming signal received on the line.

FIG. 6 illustrates how block 310 achieves the measure of the energy received from the line. Block 310 involves a succession of n taps 601a to 601k having each an output which is connected to the two inputs of a multiplier 602a to 602k in order to provide the square of the sample of the incoming signal. The output of all multipliers 602a to 602k are connected to the inputs of an adder 603 which provides at its output an estimation of $E(\times 2)$ corresponding to the energy of the signal which is received. In the preferred embodiment of the invention, the taps, the multipliers and the adder are embodied by means of the digital processing system which is also used to embody equalizer 312.

Figure 8:
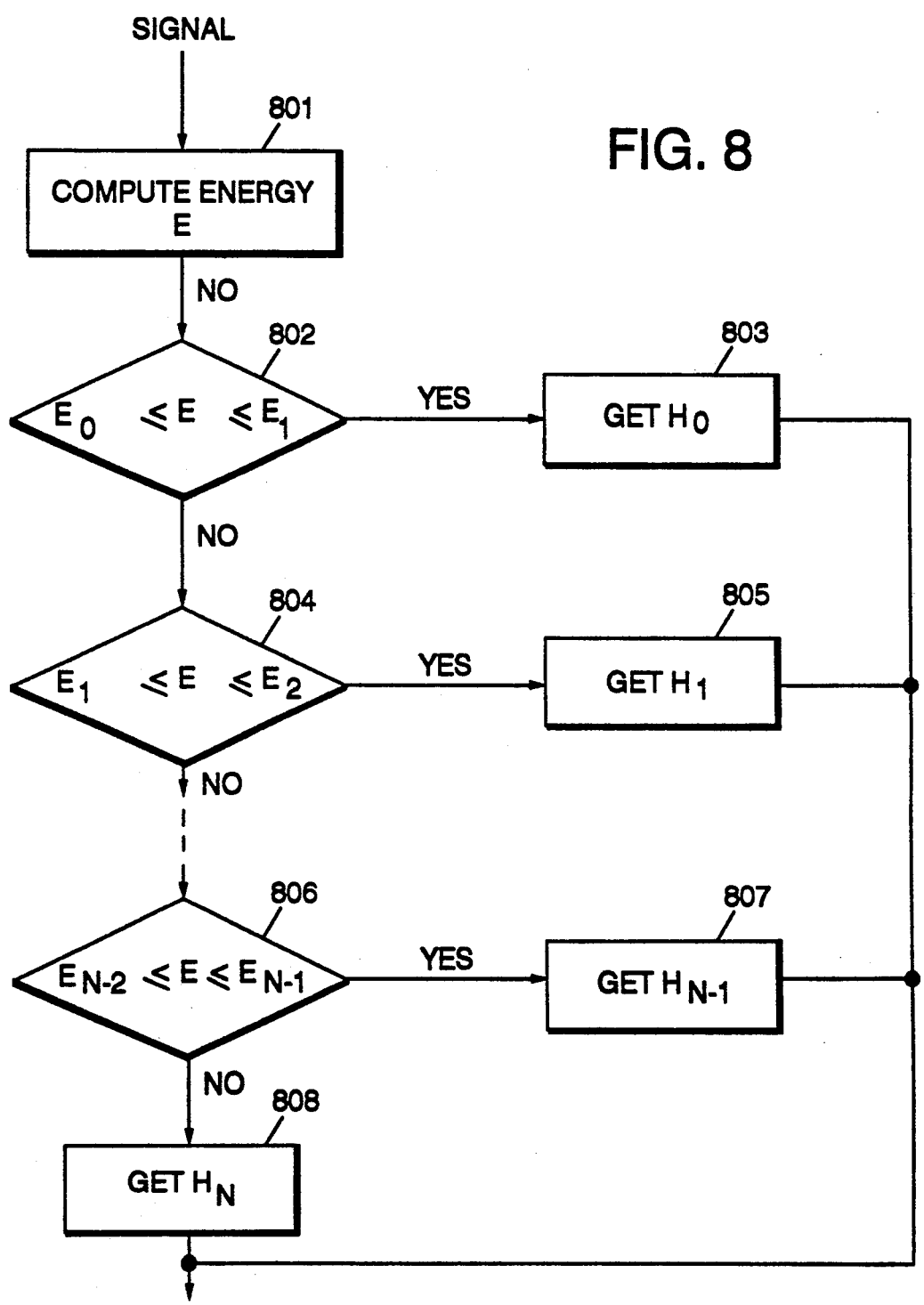
FIG. 8 is a detailed flow chart of the computation and generation process of the initial coefficient values of the equalizer in accordance with the present invention.

FIG. 8 details the computation and the generation of the set of initial coefficients which are transmitted from block 311 to equalizer 312 during the intermediate period when the modem is connected to the telecommunication network and receives data. The incoming signal is analysed and its energy is estimated in accordance with the process which has been described in reference to FIG. 6, step 801. Then, in step 802, a test is performed in order to determined if the estimated energy is comprised within the above mentioned range (E0, E1) corresponding to the first initial H0 vector which is stored in the memory. If the estimated energy is comprised within the latter range, block 311 delivers to the equalizer the first among the p H initial vectors which are stored in the memory and the intermediate period ends. The equalizer is then switched to the normal adaptive process by means of switch 309 and the gradient algorithm process will complete the adjustment of the coefficients of the equalizer in order to perfectly compensate for the attenuation characteristics of the line. Then, during the data transmission, the equalizer will remain in the normal adaptive mode and its coefficients will be continuously adjusted to the actual characteristics of the line. In the reverse case, a second test is performed in step 804 in order to determine whether the measured energy is within the second range (E1, E2) centered around the second initial vector H1 which is stored in the memory. If this is the case, block 311 extracts from the memory the value of the coefficients corresponding to the second H1 vector among the set of p H initial vectors, (step 805) and the intermediate process completes leaving it to the normal adaptive mode to complete the determination of the coefficients matching the line characteristics. In the reverse case, the process proceeds to a further step where the estimated energy is again compared to the two extreme values of the following range (E2, E3) etc. . . . In the case where the preceding tests have always failed, a similar test is again performed in step 806 in order to determine whether the estimated energy is within the range (E n−2, E n−1), in which case the penultimate H initial vector H(n−1) among the list of the p H initial vectors is delivered in step 807. In the reverse case, the attenuation level is assumed to be at its maximum value and block 311 delivers the last H initial value of the list of p H vectors in step 808. Then, the equalizer switches to the normal adaptive step in order to complete the adjustment of the coefficients of the equalization process in accordance with the gradient algorithm.

We claim:

1. An adaptive equalization system for allowing the equalization of incoming signals from a telecommunication line in a Data Circuit Terminating Equipment (DCE) within a predetermined attenuation range, said system including an adaptive equalizer capable of continuously deriving its coefficients in accordance with a predetermined adaptive algorithm and characterized in that it further includes:

means for storing a plurality of sets of initial coefficients (Hinit) for said equalizer corresponding to the attenuations of a plurality of telecommunication lines, means for measuring the energy of an incoming signal from a said telecommunication line, means responsive to said means for measuring for deriving one set of initial derived coefficients (Hinit) to be loaded into said equalizer, means for loading said coefficients in said equalizer and means for initiating said adaptive algorithm.

2. An adaptive equalization system according to claim 1 characterized in that it further includes:

means for storing a plurality of sets of initial coefficients (Hinit) for said equalizer corresponding to the attenuations of a plurality of different lines, said plurality of sets of initial coefficients (Hinit) being determined in order to assure the convergence of adaptation when the attenuation level of said telecommunication line varies within the extent of a range of values covered by said sets of initial coefficients, means responsive to said determination for selecting one among said plurality of coefficients, means for loading said set of initial coefficients in said equalizer in a preliminary phase, means for switching said equalizer to a normal adaptive mode when said selected set has been loaded.

3. An equalization system according to claim 1 or 2 characterized in that:

said equalization system includes a digital processing system involving a gradient or Mean-square adaptive algorithm.

4. An equalization system according to claim 1, or 2 characterized in that it includes:

means for comparing said measured energy with a plurality of threshold values in order to determine the initial set corresponding to the considered measured energy, means for loading said initial set into said equalizer prior to the initiation of the adaptive equalization process.

5. An equalization system according to claim 1 or 2 characterized in that said DCE is a base-band modem working at 72 kbps over lines generating an attenuation of 0 to 43 dB and that said plurality of sets of initial coefficients is formed with four different sets of initial coefficients.

6. A method for equalizing an incoming signal in a Data Circuit Terminating Equipment (DCE) including an adaptive equalizer characterized in that it involves the step of:

storing a plurality of initials sets of coefficients Hinit corresponding to a plurality of lines, measuring the energy of the incoming signal, determining the set among said sets of intial coefficients Hinit which corresponds to the nearest measured level of energy, loading said set of coefficient Hinit in said equalizer, initiating the adaptive process involved in said adaptive equalizer.

7. A method according to claim 6 characterized in that:

said adaptive process involves a gradient or mean-square adaptive process.

8. A method according to claim 6 or 7 characterized in that:

said DCE is a base-band modem intended to be connected to a digital or multipoint network.

* * * * *